United States Patent [19]

Amann et al.

[11] Patent Number: 4,918,701
[45] Date of Patent: Apr. 17, 1990

[54] SEMICONDUCTOR LASER ARRANGEMENT AND METHOD FOR THE OPERATION THEREOF

[75] Inventors: Markus-Christian Amann, Munich; Bernhard Stegmueller, Augsburg, both of Fed. Rep. of Germany

[73] Assignee: Siemens Aktiengesellschaft, Berlin and Munich, Fed. Rep. of Germany

[21] Appl. No.: 389,995

[22] Filed: Aug. 7, 1989

[30] Foreign Application Priority Data

Sep. 27, 1988 [DE] Fed. Rep. of Germany ....... 3832760

[51] Int. Cl.$^4$ .............................................. H01S 3/19
[52] U.S. Cl. ...................................... 372/50; 372/23; 372/27; 372/97
[58] Field of Search ....................... 372/50, 97, 23, 27, 372/44

[56] References Cited

U.S. PATENT DOCUMENTS 4,748,630 5/1988 Nagashima ............................ 372/50
4,794,346 12/1988 Miller .................................. 372/50

FOREIGN PATENT DOCUMENTS 0194335 9/1986 European Pat. Off. ............. 372/23

OTHER PUBLICATIONS

Grosskopf et al., publication entitled "Polarization Insensitive Optical Amplifier configurations", p. 2, lines 2 & 3, and p. 5, line 21.
Agrawal publication entitled "Lateral Analysis of Quasi-Index-Guided Injection Lasers: Transition from Gain to Index Guiding", p. 2, lines 26-27.
Amann publication entitled "Polarization Control in Ridge-Waveguide-Laser Diodes", p. 3, lines 1 & 2, p. 4, lines 24 and 25 (FIG. 1).

*Primary Examiner*—William L. Sikes
*Assistant Examiner*—Georgia Y. Epps

[57] ABSTRACT

A semiconductor laser arrangement is composed of two quasi-index guided laser diodes each with a light intensifying layer arranged in a plane shared by both diodes. The characteristics of the laser diodes are such that one polarization state predominates in one diode, while the other polarization state predominates in the other diode. Any desired degree of polarization dependency of the gain is set by the ratio of the operating currents of the two diodes, so that isotropic amplification can be achieved.

6 Claims, 1 Drawing Sheet

SEMICONDUCTOR LASER ARRANGEMENT AND METHOD FOR THE OPERATION THEREOF

BACKGROUND OF THE INVENTION

1. Field of the Invention

The present invention is directed generally to a semiconductor laser arrangement, and more particularly an arrangement of two semiconductor lasers wherein one predominately generates or amplifies waves of a defined polarization state and the other predominately generates or amplifies waves of a defined other polarization state wherein the waves generated or amplified by the two lasers are superimposed on one another.

2. Description of the Related Art

Optical amplifiers or laser amplifiers that can isotropically amplify polarized light are required in modern systems for applications in optical communications technology. To isotropically amplify denotes that light having an arbitrary polarization can be amplified with the same gain independently of the polarization. In a semiconductor laser having a light-intensifying layer, the optical amplification or intensification, is usually greatly dependent on the polarization of the light being amplified. For example, light polarized in the plane of the layer is amplified relatively greatly while light polarized perpendicularly relative to the plane is amplified relatively weakly, or not at all.

An isotropic amplification can be achieved in that the polarized light to be amplified is coupled into two semiconductor lasers arranged in series with or parallel to one another. The layers of the lasers which have the light-intensifying effect lie in planes arranged vertically relative to one another and have the same gain. An arrangement of this type is known from ECOC, 1987, pages 87-88. In this arrangement, the layer of a semiconductor laser that has a light-intensifying effect lies in the oscillatory plane of the TE mode, whereas the corresponding layer of the other semiconductor amplifier lies in the oscillatory plane of the TM mode that is polarized orthogonally relative to the TE mode. The two semiconductor lasers of this known arrangement can be joined to one another by passive, optical waveguides that preserve the polarization state. The delivery of the polarized light to be amplified as well as the further conduction of the amplified light can ensue with such waveguides.

SUMMARY OF THE INVENTION

It is an object of the present invention to provide an arrangement with which an arbitrary degree of isotropy or anisotropy of the optical gain can be set.

This and other objects of the invention are achieved in an arrangement of two semiconductor lasers which are quasi-indexguided laser diodes each having a layer with a light-intensifying effect and being arranged in a common layer plane or in layer planes parallel to one another.

The arrangement of the invention resolves the problem of isotropic optical amplification by using a structure-specific property of quasi-index-guided laser diodes which are disclosed, for example, in the Journal of Light Wave Technology, Vol. LT-2, No. 4, August 1984. Any desired degree of isotropic and anisotropic optical amplification can be set by the suitable selection of the geometrical structure data, and in particular by selection of the width of the strip waveguide present in such diodes. (In this respect, see Applied Physics Letters, 50(16), Apr. 20, 1987, pages 1038 through 1040).

In the arrangement of the present invention, the geometrical structure data of the two quasi-index-guided laser diodes are selected so that one diode preferentially amplifies one polarization state and the other preferentially amplifies the other polarization state. Any desired degree of polarization dependence on the amplification can then be set by selecting the operating currents that are supplied to these diodes. In particular, identical amplification, i.e. isotropic amplification, is achieved for both polarization states.

In an advantageous development of the arrangement, the two quasi-index-guided laser diodes of the invention are monolithically integrated.

It is expedient when the refractive entry and exit faces of the arrangement are provided with an anti-reflection coating for optical waves for use of the arrangement of the invention as an amplifier wherein any desired degree of polarization dependency on the gain can be set.

Another preferred embodiment of the arrangement of the invention has reflective faces for the optical waves at the refractive entry and exit faces of the arrangement. It is thus possible to provide with this development a frequency-selective Fabry-Perot amplifier or a polarization-bistable transmission element that can be very quickly modulated.

A method for operating the arrangement of the invention proceeds from the realization of a transmitter arrangement which is bistable with respect to two different polarization states.

The isotropic amplification of the semiconductor arrangement of the invention finds particular utility in long distance communications.

The laser diodes of the present invention, depending on their application, may either amplify one polarization state, if used as an optical amplifier, for example, or they may generate one polarization state, used as a source, for example.

DETAILED DESCRIPTION OF THE PREFERRED EMBODIMENTS

Figure 1:
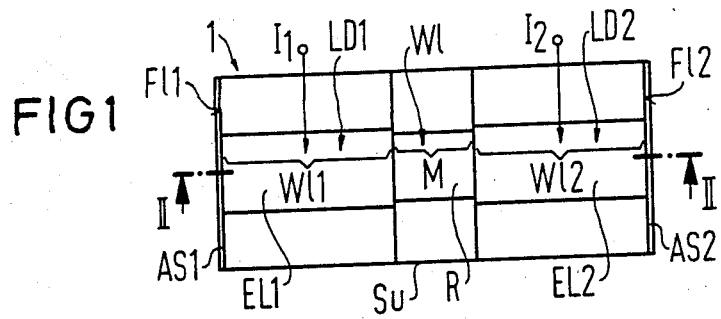
FIG. 1 is a plan view of an arrangement composed of two monolithically integrated quasi-index-guided laser diodes connected in series following one another according to the principles of the present invention.
Figure 2:
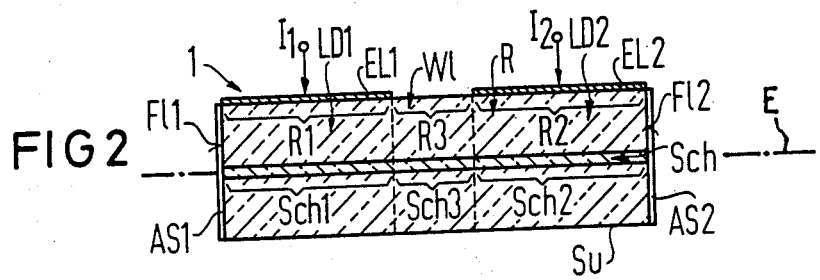
FIG. 2 is a longitudinal cross section taken generally along line II—II through the arrangement of FIG. 1.

In the exemplary embodiment of FIGS. 1 and 2, a strip waveguide W1 in the form of a rib or ridge waveguide is defined in a known fashion on a substrate Su. (In this respect, see Applied Physics Letter, 50(16), Apr. 20, 1987, page 1038 and in particular, FIG. 1 thereof). The strip waveguide W1 is essentially composed of a light guiding, light intensifying layer Sch arranged within the substrate Su in a layer plane E, as well as of a rib or ridge R at the surface of the substrate SU arranged over the layer Sch. An electrode EL1 is applied to a left-hand end section of the ridge R and an electrode EL2 is applied to the right-hand end section.

The ridge waveguide W1 has a left-hand end section WL1 which is composed of a left-hand end section R1 of the ridge R and a left-hand section Sch1 of the layer Sch situated therebelow. Together with the left-hand end section WL1 of the ridge waveguide W1 situated therebelow, the electrode EL1 defines a quasi-index-guided laser diode LD1. The other electrode EL2 together with the right-hand end section WL2 of the ridge waveguide WL situated therebelow and composed of the right-hand end section R2 of the ridge R and the end section Sch2 of the layer Sch situated therebelow defines another quasi-index-guided laser diode LD2. An electrode-free middle section M of the strip waveguide WL that is situated between the diodes arranged at a distance from one another and that is composed of a middle section R3 of the ridge R and of the middle section Sch3 of the layer Sch connects the diodes LD1 and LD2 so that the diodes are connected in series with one another.

The two diodes LD1 and LD2 may also be connected parallel to one another, similar to the semiconductor amplifier according to ECOC 87, page 88, FIG. 1b thereof, whereby, however, the two light intensifying layers of the diodes are not be arranged perpendicular to one another as disclosed therein but are instead parallel to one another in the present invention.

The geometrical structure data of the laser diode LD1, for example, the width D1 of the left-hand end section WL1 of the strip waveguide WL, is selected such that it preferentially intensifies one polarization state, such as for example, the TE mode. The geometrical structure data for the other diode LD2, for example, the width D2 of the right-hand end section WL2 of the waveguide WL, are selected such that it preferentially intensifies the other polarization state such as, for example, the TM mode.

Figure 3:
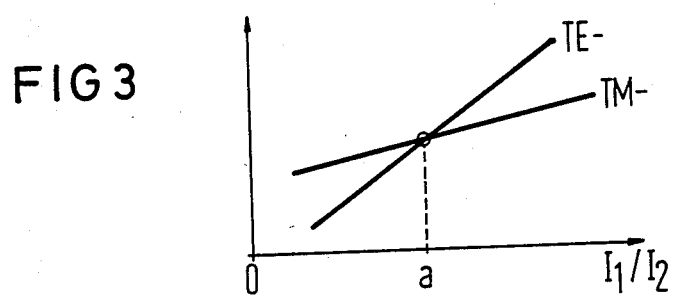
FIG. 3 is a graph of the overall gain of the arrangement shown in FIG. 1 depending upon the ratio of the operating currents $I_1$ and $I_2$ applied to the two diodes.

With reference FIG. 3, the intensification, or amplification, of the arrangement according to FIGS. 1 and 2 is entered qualitatively over the ratio of the operating currents $I_1$ or $I_2$ of the diodes LD1 and LD2 that are applied to the electrodes EL1 and EL2. As may be derived from the diagram of FIG. 3, the TM mode amplification prevails over the TE mode amplification in values of $I_1/I_2$ that are smaller than a defined value a. The TE mode amplification prevails over the TM mode amplification for values of $I_1/I_2$ that are greater than the value a. At the defined value a, which can be equal to 1 in specific instances, the TE mode amplification is equal to the TM mode amplification so that isotropic amplification is present.

In the operation of the arrangement according to FIGS. 1 and 2 upon which the graph of FIG. 3 is based, the outer refractive end faces of the diodes LD1 and LD2 formed by the end faces FL1 and FL2 of the substrate SU are preferably coated with an anti-reflection coating such as the anti-reflection coatings AS1 and AS2 that are applied to the end faces FL1 and FL2.

When the arrangement of FIGS. 1 and 2 is operated as a frequency selective Fabry-Perot amplifier or as a polarization bistable transmission element, the end faces FL1 and FL2 are not provided with an anti-reflection coating, so that the end faces reflect. The end faces can even be provided with a mirror coating.

In the operation of the polarization bistable transmission element, the ratio $I_1/I_2$, for example, is set so that the laser emission is at one of the two polarization states. The operating current of the diodes that predominantly amplifies the other polarization state is modulated so that the arrangement alternates between the two polarization states. When, for example, the TE mode polarized laser emission is set by the selection of the operating currents $I_1$ and $I_2$ and the modulation I (t) is impressed on the operating current $I_2$, then the laser emission from the semiconductor laser arrangement alternates between the TE mode and TM mode. This alternating between modes can ensue very quickly so that a fast modulation of the laser diodes is possible.

Figure 4A:
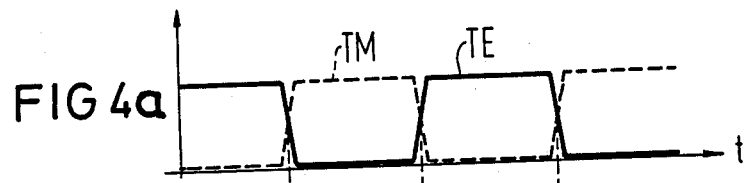
FIG. 4a is a graphic illustration of the optical power output of an arrangement as shown in FIGS. 1 and 2 operated as polarization bistable transmission element.
Figure 4B:
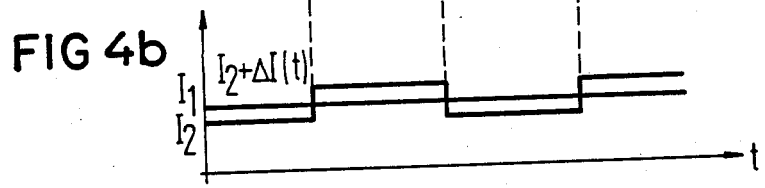
FIG. 4b is a graphic illustration of the applied operating currents $I_1$ and $I_2$ over time t.

In FIGS. 4a and 4b is qualitatively shown the relationships for the recited example just described. In FIG. 4b, the two preset operating currents $I_1$ and $I_2$ as well as the modulation I (t) impressed on the operating current $I_2$ are shown over time t. The optical power output for the laser arrangement is shown over time in the graph of FIG. 4a, the optical power alternating between TE mode polarization and TM mode polarization. In the graph of FIG. 4a, the chronological curve of the optical power of the TE mode emitted by the laser arrangement is shown with the solid line TE, while the optical power curve of the TM mode is shown with the broken line curve TM.

The TM polarized light which has been modulated with a high degree of modulation can be coupled out through a polarization filter that allows only one polarization state to pass, for example, only the TM mode polarized light without a significant steady radiation level.

Thus, there has been shown and described a semiconductor laser arrangement formed by semiconductor lasers connected following one another or parallel to one another with which an arbitrary degree of isotropy or anisotropy of the optical gain factor can be set. The two semiconductor lasers are formed of quasi-index guided laser diodes, each having a light intensifying, or laser active, layer lying in a layer plane shared by both diodes. A desired degree of polarization dependency of the gain can be set by the ratio of the operating currents of the diodes to achieve, for example, isotropic amplification. Lasers according to the present invention find particular use in long distance telecommunications.

Although other modifications and changes may be suggested by those skilled in the art, it is the intention of the inventors to embody within the patent warranted hereon all changes and modifications as reasonably and properly come within the scope of their contribution to the art.

We claim:

1. A semiconductor laser arrangement, comprising: first and second semiconductor laser connected to one another, said first semiconductor laser predominantly generates or amplifies waves of a first defined polarization state, said second semiconductor laser predominantly generates or amplifies waves of a second defined polarization state, said first and second semiconductor laser being quasi-index-guided laser diodes each having an active layer in planes parallel to one another.

2. A semiconductor laser arrangement as claimed in claim 1, wherein said active layers are in a common plane.

3. A semiconductor laser arrangement as claimed in claim 1, wherein said quasi-index-guided laser diodes are monolithically integrated.

4. A semiconductor laser arrangement as claimed in claim 1, wherein said laser diodes each have refractive entry and exit faces, and further comprising:
an anti-reflection coating for optical waves on said entry exit faces.

5. A semiconductor laser arrangement as claimed in claim 1, wherein said laser diodes have reflective entry and exit faces.

6. A method for operating a semiconductor laser arrangement of two lasers, one of the lasers predominantly generates or amplifies waves of a defined first polarization state and a second of the lasers predominantly generates or amplifies waves of another second polarization state, comprising the step of:
modulating a ratio of operating currents of the two lasers between two values, said two values being such that one of said two values causes the first polarization state to prevail in said arrangement and a second of said two values causes the second polarization state to prevail in said arrangement so that said arrangement is bistable for two different polarization states.

\* \* \* \* \*